United States Patent [19]

Brewer

[11] 3,916,035

[45] Oct. 28, 1975

[54] EPOXY-POLYMER ELECTRON BEAM RESISTS

[75] Inventor: Terry L. Brewer, Plano, Tex.

[73] Assignee: Texas Instruments Incorporated, Dallas, Tex.

[22] Filed: Nov. 5, 1973

[21] Appl. No.: 412,935

[52] U.S. Cl. .................... 427/43; 96/35.1; 96/36.2; 204/159.13; 204/159.14; 427/273

[51] Int. Cl.[2] .................... B05D 3/06; C08G 77/42; C08G 83/00

[58] Field of Search .... 117/93.31, 161 ZA, 161 ZB; 96/35.1, 36.2; 204/159.13, 159.14

[56] References Cited

UNITED STATES PATENTS

| | | | |
|---|---|---|---|
| 3,573,334 | 3/1971 | Wheeler | 204/159.14 |
| 3,681,103 | 8/1972 | Brown | 117/93.31 |
| 3,794,510 | 2/1974 | Scala et al. | 117/93.31 |
| 3,816,281 | 6/1974 | Feinberg | 117/93.31 |

*Primary Examiner*—J. H. Newsome
*Attorney, Agent, or Firm*—Gary C. Honeycutt; James T. Comfort; Hal Levine

[57] ABSTRACT

Disclosed is a method of making patterned negative electron beam resists by first mixing but not reacting an epoxy with a polymer. The epoxy-polymer mixture is then applied to a support in the form of a thin film. Upon irradiating a portion of the thin film with an electron beam according to a programmed pattern, the epoxy links with the polymer, thereby causing cross linkage of the polymer and making the irradiated portion insoluble in certain solvents. The remainder of the epoxy-polymer mixture is soluble in the solvent, thereby dissolving in the solvent and removed, resulting in the desired pattern of openings in the electron beam resist.

9 Claims, No Drawings

EPOXY-POLYMER ELECTRON BEAM RESISTS

BACKGROUND OF THE INVENTION

1. Field of the Invention

This invention relates to negative electron beam resists for photomask fabrication and for actual semiconductor device fabrication.

2. Description of the Prior Art

The use of light as the irradiator for fabricating photoresists in the semiconductor art has been common for many years. The photoresist method of semiconductor manufacture was adequate until the advent of small geometry high frequency devices and integrated circuits requiring the formation of patterns with line widths in the neighborhood of 1 micron. Although 1 micron line opening, or resolution, can be obtained from photoresists in the laboratory, such line widths are not reproducible due to diffraction problems, with the practical limit of production produced openings being in the neighborhood of 5 to 6 microns in width.

The step from the use of light to electrons to form resists was a logical one. Theoretically, since the size of an electron is at least 1/1000th the size of a quantum of light, an electron beam should be able to produce openings with line widths much smaller than the openings obtained with photoresists. However, due to electron bounce-back from the surface supporting the resist, such small width openings are not obtainable, only 1000 A being the practical lower limit in size. Electron beam microdefinition technology differs quite drastically from photoresist technology in that in photoresist technology designers make large patterns out of a sheet of red plastic with the definition of the different elements of the pattern resulting from the cutting out of certain areas. The large plastic sheet is then photographed and reduced a number of times to bring the pattern down to the correct size so that the pattern can be transferred by light to the photoresist. In production, this procedure usually takes from 1 to 2 weeks from the design stage to the patterned resist.

In the case of electron beam technology, an electron beam is scanned across the resist itself to form the desired pattern. The electron beam is controlled by a computer which has been fed the coordinates of the pattern as previously determined by a designer. Thus, the use of the electron beam has eliminated all the time lost in preparing the reduction photography required to form a patterned photoresist. However, due to the pattern in the electron beam resist beam resulting from the scan of a very narrow electron beam, the reaction time of the resist to the electron beam is the time drawback to the production use of electron beam resists.

Obviously, then, in addition to the characteristics required of a good photoresist, such as: good adhesion to many materials, good etch resistance to conventional etches, solubility in desired solvents, and thermostability, an electron resist must react to the electron beam irradiation fast enough to allow a reasonable scan time of the electron beam. In order to bring electron beam technology into production status, resists composed of thin polymer films that are capable of retaining an image of 1 micron or less at very high scanning speeds of the electron beam are required.

A number of approaches have been taken in the past to develop practical electron beam resists. The first approach and one that proved to be the least successful was the use of conventional photoresists, which are also polymers. Although capable of being exposed at relative high scan rates, such resists exhibit line widths, i.e., resolutions, greater than 1 micron in width.

The most widely used electron beam resist today is polymethyl methacrylate (PMMA), a positive resist. PMMA is characterized by excellent resolution and line width characteristics and by good processability. However, PMMA requires a relatively slow exposure rate, of approximately $5 \times 10^{-5}$ coulombs/cm$^2$, and has the inability to withstand strong oxidizing acids and base etches. A good electron beam resist must react at least 10 times faster than PMMA and must withstand strong acid and base etches.

There are many homopolymers and copolymers that can be used for negative electron beam resists, (a negative electron beam resist comprises a polymer that cross links upon being electron beam irradiated and becomes insoluble in certain solvents; a positive resist comprises a polymer that is insoluble in certain solvents but will degrade upon being electron beam irradiated and becomes soluble in certain solvents) such as polystyrene, polysiloxane and the polystyrene-butadiene copolymer described in my copending application entitled *Styrene-Diene Copolymer Electron Beam Resists.* In all cases of the above mentioned polymers being used as electron beam resists, an increase in the electron beam scanning speed, thus allowing for faster process time of the negative resist, is desirable.

Therefore, an object of this invention is to provide a method of forming a negative electron beam resist by adding a material to a slow scanning speed resist which increases the scanning speed over the resist without the additive.

Another object of this invention is to provide a method of forming a negative electron beam resist by adding a material to a slow scanning speed resist without affecting the other characteristics required of a good electron beam resist, such as resistance to strong oxidizing acids and base etches, good adhesion to many materials, solubility in many common solvents and has thermostability.

SUMMARY OF THE INVENTION

Briefly, the invention involves the addition of an epoxy solution to a polymer solution, the polymer being either a homopolymer or copolymer. The epoxy does not react nor form any chemical bonds with the polymer. The epoxy-polymer solution is then applied as a liquid to a support and allowed to dry to a thin film. An electron beam is caused to sweep or scan across the surface of the epoxy-polymer film in the desired pattern to form a negative resist by imparting sufficient energy to the epoxy to cause it to react and link with the polymer thereby cross linking the polymer (the polymer being a negative resist when used alone). The cross linked portion of the epoxy-polymer film becomes insoluble to many common solvents due to the cross linkage, while the unirradiated portion of the epoxy-copolymer film is unaffected. After the electron beam scanning is completed, the resist is subjected to a solvent of the aromatic class which does not affect the irradiated portion of the resist but dissolves and removes the unirradiated portion of the resist, leaving openings that correspond to the desired pattern.

The novel features believed characteristic of this invention are set forth in the appended claims. The invention itself, however, as well as other objects and advantages thereof, may best be understood by reference to the following detailed description.

DETAILED DESCRIPTION OF THE INVENTION

Certain polymers, either homopolymers or copolymers, upon being subjected to irradiation by an electron beam, or other high energy source, such as X-rays of alpha particles, for example, will tend to form active species due to the increased energy supplied by the electron beam and the active species or active centers will effect cross linkage of the polymer. The cross linkage makes the electron beam resist a negative resist. The polymer, prior to cross linkage is soluble in many common solvents, but upon being cross linked the polymer thereby becomes insoluble, the degree of solubility being directly related to the amount of cross linkage. The permissible scanning speed of the electron beam is dependent upon the amount of energy that is required to cause the cross linkage and subsequently the desired degree of insolubility of the resist film. An increase of the scanning speed of an electron beam resist is very desirable due to the decrease in the time necessary to form the patterned resist.

This inventor has found that by adding an epoxy

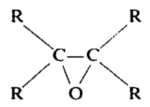

(R is the formula being any atom, such as H, Cl and C, for example) to a polymer that acts as a negative electron beam resist, the electron beam scanning speed of the polymer is increased without effecting any of the other characteristics of the polymer as a negative electron beam resist. The epoxy is added to the polymer to form a mechanical epoxy and polymer mixture and does not form any chemical bonds or react with the polymer in any manner until the epoxy and polymer mixture (the polymer being either a homopolymer or copolymer) is irradiated with sufficient energy by a high energy source, such as an electron beam, at which time cross linkage occurs.

The mechanism that is believed to be involved upon the introduction of sufficient energy is that the electrons break the bonds between the oxygen and the carbon three-member ring

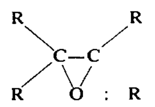

(dots representing the broken bonds) leaving two activated centers on the same molecule. The epoxy molecule links up with two polymers at two points, thereby cross linking the polymers, and becomes a part of the polymer. Obviously, at the same time, some of the electrons cause cross linkage between the polymer itself, but this polymer-polymer cross linkage is slower than the polymer-epoxy-polymer cross linkage. The advantage of adding epoxy in this manner is that no complex synthesizing is required as is necessary when the epoxy group is incorporated into the polymer chemical structure prior to irradiation.

The scanning speed of any polymer that will cross link upon being irradiated by a high energy source can be increased by the addition of an epoxy, such as a cyclohexylepoxy, commercially available as ERRA-4090, from Union Carbide. When a mixture of 10% ERRA and 90% polystyrene

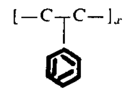

is processed to form a negative electron beam resist, the scanning speed of the epoxy and polystyrene resist, as compared to the pure polystyrene resist is increased by a factor of 3. When a negative electron beam resist, comprising a mixture of 10% ERRA and 90% styrene-butadiene

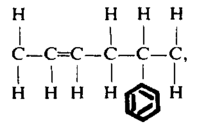

is prepared, the speed of the epoxy and styrene-butadiene resist, as compared to the pure styrene-butadiene resist, is increased by a factor of 50%. The scanning speed of a negative electron beam resist made from a mixture of 10% ERRA and 90% polydimethylsiloxane, as compared to the pure siloxane resist, was increased by a factor of 3.

An interesting effect of the addition of epoxy to a polymer is that the epoxy seems to increase the speed of the slower scanning speed polymers more than the faster speed polymers. In other words, the faster the polymer cross links by itself, the less effect the addition of the epoxy has on increasing the cross linkage speed. The reason for this is that the electrons that penetrate the epoxy-polymer thin film are nonselective and the electrons obviously are hitting both the epoxy molecules and the polymer molecules. If the polymer is fast, the polymer will react fast anyway and the scanning speed boost attained by the cross linkage effect of the epoxy is negligible.

Another interesting aspect of the epoxy addition is that the molecular weight of the polymer has no relationship to the increase in speed due to the epoxy additive. For example, if an epoxy added to a polymer with a molecular weight of 30,000 increases the cross linkage speed of the polymer by a factor of 3, the epoxy added to the same polymer having a molecular weight of 90,000 increases the cross linkage speed of the higher weight polymer also by only a factor of 3.

Because the processes of forming negative electron beam resists by adding epoxies to polymers to form mixtures are all quite similar, only a typical process of adding an epoxy to polystyrene will be described. The epoxy compound, ERRA-4090 is added as a solid to a aromatic solvent, such as xylene or toulene to form a 0.5% concentration. Solid polystyrene is added also to the same solvent to form a 5% solution. The two solutions are mixed to form a solution of polystyrene and epoxy. The ratio of epoxy to polystyrene, by weight, will range from a low of about 5% to a high of about 30% with the optimum amount being about 10%. Although a greater amount of epoxy will furnish a greater amount of reaction centers to promote cross linkage, the epoxy in higher concentrations than 20% tends to separate out from the mixture upon the formation of a dry thin film thereby resulting in a nonuniform coating.

The epoxy and polystyrene solution can vary from approximately 2% to 10% by weight for example, according to the desired thickness of the dried film. The higher the percentage of solids in the solution the thicker the dried thickness of the thin film and although a very thin film is desired for increased resolution (decreased line widths) a thicker film is desired for increased resistance to the acid and base etches used to etch the underlying support and for uniformity of the film.

While a method of forming an electron beam resist will be described to form a mask on a chromium plate or support for subsequent use as a photoetch mask to etch semiconductor wafers, the method of this invention is also used for direct application of the resist to the semiconductor wafer with the chrome etch being replaced by a semiconductor etch.

A small amount of the epoxy and polystyrene solution is applied to the chrome support and the chrome support with the covering epoxy and polystyrene solution is spun at a speed of approximately 3000 rpm, for example, in order to form a uniform layer of epoxy and polystyrene on the support as a thin film. The thin film is baked to remove the solvent, if at all, at a temperature below 40° C; at higher baking temperatures, the epoxy will tend to decompose. The chrome substrate with the thin film of epoxy and polystyrene is then placed in an electron beam irradiator and electron beam is allowed to scan the surface of the thin film in a predetermined pattern. The electron beam furnishes sufficient energy to cause the epoxy to increase the cross linkage of the polystyrene and for the epoxy to become a part of the polymer structure. The portions of the epoxy and polystyrene mixture subjected to the electron beam cross link are not effected by the subsequent development with an aromatic solvent. The epoxy-polystyrene resist is developed by spraying or dipping the thin film covered chrome support in a aromatic solvent for approximately 30 seconds which is a sufficient length of time to dissolve and remove the unirradiated portions of the epoxy-polystyrene thin film, leaving a resist having the desired pattern of openings. To harden the cross linked pattern remaining on the chrome support, the resist covered support is baked at a temperature of between 80° C and 180° C. in any atmosphere, preferably air for convenience, for approximately 30 minutes. This completes the method of this invention.

For use as a mask, the chrome support with its patterned resist is subjected to a chrome etch for a period of time sufficient to remove the chrome exposed by the openings in the resist. Finally, the resist is removed by dipping the resist covered chrome support in diethylphthalate at 170° C for 30 minutes, or by spraying with a hot dioxane-pyrrolidone solution. The patterned chrome support is now ready to be used to form an image on a photoresist formed on a semiconductor wafer. The specific temperatures and times given are not critical to the invention.

As has been previously stated, the addition of the epoxy to a polymer, such as polystyrene, for example, to form a negative electron beam resist has no effect on any of the characteristics of the polymer as a negative resist except the epoxy increases the cross linkage speed which permits an increased electron beam scanning speed.

Although, specific embodiments of the invention have been described in detail, it is to be understood that various changes, substitutions and alterations can be made therein without departing from the spirit and the scope of the invention as defined by the appended claims.

What is claimed is:

1. The method of forming a patterned negative high energy beam resist, comprising the steps of:

a. forming a thin film of a mixture of a compound having an epoxy group, and a polymer which cross-links to become insoluble when exposed to an electron beam, said mixture having a ratio of epoxy to polymer between 5% and 30% by weight, on a support;

b. scanning said thin film with a high energy beam in a predetermined pattern at a speed sufficient to cause the irradiated portion of said epoxy and polymer mixture to cross link where irradiated by said high energy beam, said epoxy becomming a part of the polymer structure; and c. dissolving the uncross-linked portion of said epoxy and polymer mixture with a solvent which dissolves and removes the uncross-linked epoxy and polymer mixture, thereby leaving said cross linked portion of said epoxy-polymer on said support with openings in a desired pattern.

2. The method of forming a patterned negative high energy beam resist, as defined in claim 1, wherein said polymer is polystyrene.

3. The method of forming a patterned negative high energy beam resist, as defined in claim 1, wherein said polymer is polystyrene-butadiene.

4. The method of forming a patterned negative high energy beam resist, as defined in claim 1, wherein said polymer is polydimethylsiloxane.

5. The method of forming a patterned negative high energy beam resist, as defined in claim 1, wherein said high energy beam is an electron beam.

6. The method of forming a negative electron beam resist, comprising the steps of:

a. mixing a compound having an epoxy group with a polymer which crosslinks to become insoluble when exposed to an electron beam, said mixture having a ratio of epoxy to polymer between 5% and 30% by weight;

b. adding solvent to said mixture to form a solution;

c. placing said solution on a support;

d. drying said solution to remove said solvent, thereby leaving a thin epoxy and polymer film on said support;

e. scanning said thin film with an electron beam in a predetermined pattern at a speed sufficient to cause the irradiated portion of said epoxy and polymer mixture to crosslink where irradiated by said electron beam, said epoxy becoming a part of the polymer structure; and, f. dissolving the uncross linked portion of said epoxy and polymer mixture with a solvent which removes the uncross linked epoxy and polymer mixture, thereby leaving said cross linked portion of said epoxy-polymer on said support with openings in a desired pattern.

7. The method of forming a negative electron beam resist, as defined in claim 6, wherein said polymer is polystyrene.

8. The method of forming a negative electron beam resist, as defined in claim 6, wherein said polymer is polystyrene-butadiene.

9. The method of forming a negative electron beam resist, as defined in claim 6, wherein said polymer is polydimethysiloxane.

* * * * *